United States Patent
Stribley

(10) Patent No.: US 9,524,963 B2
(45) Date of Patent: Dec. 20, 2016

(54) SEMICONDUCTOR DEVICE

(71) Applicant: X-FAB Semiconductor Foundries AG, Erfurt (DE)

(72) Inventor: Paul Ronald Stribley, Devon (GB)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 13/833,684

(22) Filed: Mar. 15, 2013

(65) Prior Publication Data

US 2014/0264740 A1    Sep. 18, 2014

(51) Int. Cl.
| | |
|---|---|
| H01L 23/52 | (2006.01) |
| H01L 27/08 | (2006.01) |
| H01L 29/24 | (2006.01) |
| H01L 49/02 | (2006.01) |

(52) U.S. Cl.
CPC ........... *H01L 27/0805* (2013.01); *H01L 28/60* (2013.01)

(58) Field of Classification Search
CPC .. H01L 23/5223; H01L 27/0805; H01L 28/40; H01L 2924/3011; H01L 28/60
USPC ....................................................... 257/532
See application file for complete search history.

(56) References Cited

U.S. PATENT DOCUMENTS

| | | | |
|---|---|---|---|
| 6,777,776 B2* | 8/2004 | Hieda ................. | H01L 27/0733 257/532 |
| 8,191,217 B2 | 6/2012 | Dunn et al. | |
| 2006/0225007 A1* | 10/2006 | Wang et al. ...................... | 716/2 |
| 2007/0202656 A1* | 8/2007 | Park ....................... | H01L 28/60 438/393 |
| 2007/0293014 A1* | 12/2007 | Kim .................. | H01L 21/32139 438/381 |
| 2008/0157277 A1* | 7/2008 | Park ....................... | H01L 28/40 257/532 |
| 2010/0276783 A1* | 11/2010 | Cathey .................... | H01L 28/40 257/532 |
| 2010/0279484 A1* | 11/2010 | Wang ...................... | H01L 28/75 438/396 |
| 2011/0032659 A1* | 2/2011 | Dunn ................... | H01G 4/1209 361/313 |
| 2011/0032660 A1* | 2/2011 | Dunn ................... | H01G 4/1209 361/313 |

* cited by examiner

*Primary Examiner* — John C Ingham
*Assistant Examiner* — Didarul Mazumder
(74) *Attorney, Agent, or Firm* — Nixon & Vanderhye PC

(57) ABSTRACT

A semiconductor device comprising:
  a first, a second and a third conductive layer;
  the second conductive layer being located between the first and third conductive layers;
  wherein respective regions of the first and second conductive layers form a first capacitor; and
  respective regions of the second and third conductive layers form a second capacitor.

20 Claims, 2 Drawing Sheets

SEMICONDUCTOR DEVICE

BACKGROUND

The present invention relates to a semiconductor device. Embodiments of the invention provide a semiconductor device with at least two capacitors.

Capacitors are useful components which are used within many different electronic applications, e.g. for mixed-signal and analogue circuits. In modern semiconductor processes the metal-insulator-metal, MiM capacitor type has been especially developed so that it can be fabricated alongside other key semiconductor components, e.g. (without limitation) CMOS transistors, to allow complex circuits to be manufactured on silicon chip integrated circuits. The present specification includes several references to MiM capacitors, but it will be understood that the present invention also finds application with other types of capacitors.

In most semiconductor devices having two or more MiM capacitors the capacitors are made with one type and thickness of dielectric material sandwiched between two conductor layers. The choice of the layer dielectric material type and its thickness determines the capacitance density (capacitance per unit area) and the breakdown voltage value. Dielectric breakdown voltage limits the maximum voltage that a capacitor can withstand within a circuit. Thicker dielectrics are needed to obtain greater breakdown voltages. But thinner dielectrics have higher capacitance density, which allows the area of an individual capacitor to be made smaller.

SUMMARY

The present inventor has appreciated that reducing the capacitor area may be beneficial to increase the circuit yield and to minimise the cost. He has also appreciated that sometimes there is a need to offer capacitors and other components on a combined circuit which will operate at different voltages. High voltage devices will normally require high voltage capable capacitors for power applications. But filters and RF circuits which operate at lower voltages also require capacitors. In the case of low voltage circuits the capacitance density should be maximised to minimise the total circuit area.

Mindful of the above need, the inventor has appreciated that it may be advantageous to offer different capacitors made on the same IC which are separately adapted for either higher voltage or lower voltage use. He has further appreciated that it would be useful if it was possible to make capacitors on the same IC using different dielectric materials so that capacitors can have different capacitance density (capacitance per unit area). The inventor has further appreciated that it would be advantageous if the process stages used for the two types of capacitors were the same wherever possible, to reduce processing costs. Dielectric thicknesses would normally be chosen so that they have a manufacturable (controllable) deposition thickness, but also give a useful voltage capability within a circuit, combined with a high capacitance density.

Accordingly, in one aspect the present invention provides a semiconductor device comprising:
a first, a second and a third conductive layer;
the second conductive layer being located between the first and third conductive layers;
wherein respective regions of the first and second conductive layers form a first capacitor; and
respective regions of the second and third conductive layers form a second capacitor.

According to a second aspect the present invention provides a semiconductor device comprising:
a first and a second capacitor, each having a lower plate and an upper plate made from conductive material;
wherein the upper plate of the first capacitor is located at the same level within the semiconductor device as the lower plate of the second capacitor.

According to a third aspect the present invention provides a method of forming a semiconductor device, the method comprising:
forming at least two discrete regions of a first conductive layer;
forming at least two discrete regions of a second conductive layer over the first conductive layer; and
forming a plurality of discrete regions of a third conductive layer over the second conductive layer;
wherein respective regions of the first and second conductive layers form a first capacitor; and
respective regions of the second and third conductive layers form a second capacitor.

DETAILED DESCRIPTION

The present disclosure describes how low voltage and high voltage MiM components, which may be adjacent, may be manufactured on an IC, whilst aiming to minimise the cost and complexity associated with extra processing steps and photolithographic masks. That way, the two types of devices can be made together, yet separately optimised, for a cost effective integrated circuit solution.

Figure 1:
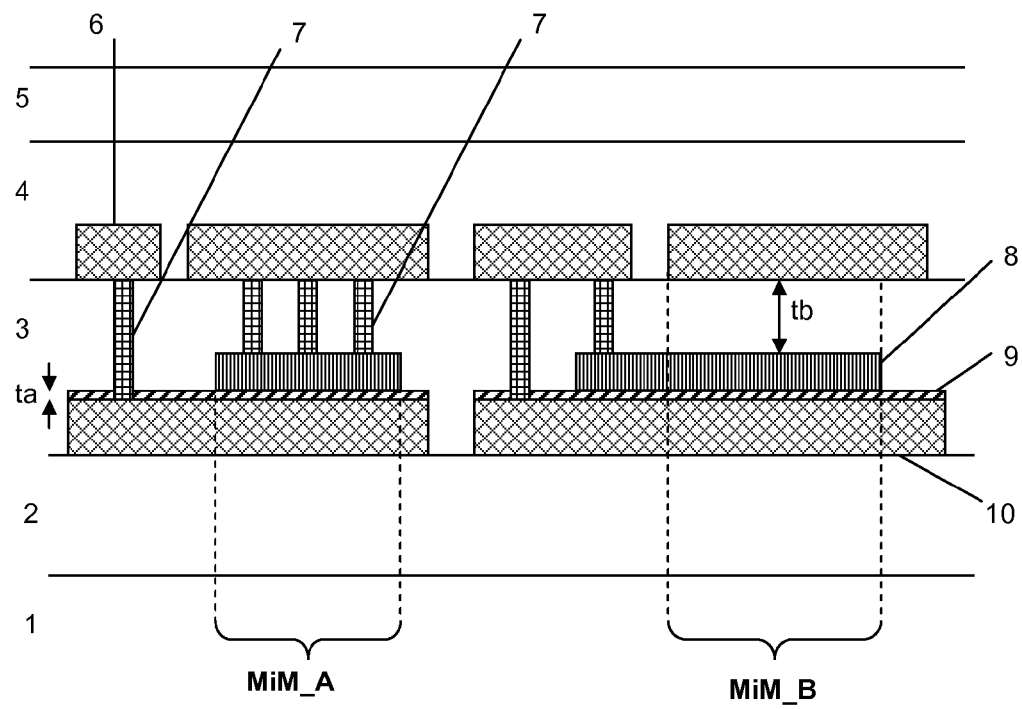
FIG. 1 shows a cross sectional view according to a first embodiment of the present invention.

FIG. 1 illustrates an embodiment of the invention, with two MiM capacitors, MiM_A (low voltage) and MiM_B (high voltage). The device is made within the metallisation wiring layers of an IC, sometimes called the BEOL (back-end of line) stages of IC manufacture. A first conductive layer 10, in the example a metal wiring layer 10, such as aluminium or aluminium alloy (e.g. primarily aluminium with a smaller amount of copper or other type of metal), is deposited upon a non-conductive lower layer 2. The aluminium of wiring layer 10 may be sandwiched between two thin titanium nitride layers so that the aluminium and titanium nitride layers together form the material of wiring layer 10. However, for the sake of clarity a single layer 10 is shown in FIG. 1.

The non-conductive lower layer 2 may comprise silicon dioxide intermetal dielectric IMD and also interlayer dielectric, ILD. The non-conductive layer 2 is formed on a semiconductor wafer substrate 1, which could be silicon. The details of these underlying layers are not described here, to concentrate on the features of the processing which are relevant to the integration of the MiM capacitors. However there may be many semiconductor components made within the layers which exist below the MiMs, and one skilled in the art will be able to understand the principles of the present invention without these details being described here.

A thin dielectric film 9, for example silicon dioxide or silicon nitride is deposited onto the conductive layer 10. These layers are photolithographically printed and etched into isolated shapes upon the non-conductive layer 2. Two such shapes or areas are shown in FIG. 1, but it will be appreciated that these layers could be formed into more than two such shapes. These shapes form the lowermost conductor wiring pattern of the capacitors. The dielectric layer 9 forms the dielectric used in the low voltage MiM_A device.

Next a second conductive layer 8, such as titanium nitride and/or aluminium, is deposited or otherwise formed on top of the lower wiring layer shapes. This layer can be formed initially as a substantially continuous layer but it could also be formed into discrete areas from the outset. In any event, the conductive layer 8 can be photolithographically patterned and etched to form the upper conductor plate of the low voltage MiM (MiM_A) and simultaneously the lower conductive plate of the high voltage MiM (MiM_B).

Another non-conductive layer 3, such as silicon dioxide intermetal dielectric IMD, is added on top of these shapes. This may then be flattened, for example by a chemical mechanical polishing technique, to make the top surface substantially flat. Depending on the intended application, it may be made flat to a high degree of perfection.

On top of this a vias connection pattern is photolithographically printed and etched to make (vertical) holes through the layers 3 and 9 to allow electrical connections to be made to the conductive layers 8 and 10 (which are intended to form the lower plates of the capacitors). The conductive vias 7 can for example be made with tungsten plugs. To this end, tungsten metal is deposited on the wafer, including down the vertical holes in layer 3. This is done by means of a chemical reaction. The surplus tungsten can then be chemically etched or mechanically polished away, so that only the vertical connection tungsten plugs 7 remain.

A third conductive layer 6 is deposited on the wafer. It is photolithographically printed and etched to form the upper wiring layers of the MiM capacitors. The rightmost portion of layer 6 in FIG. 1 forms the upper plate of the high voltage MiM capacitor MiM_B. In the area of the low voltage MiM capacitor MiM_A, portions of layer 6 form part of the connection to the lower and upper plates.

A non-conductive layer such as silicon dioxide intermetal dielectric IMD 4 may be deposited on the wafer to ensure that the conductor shapes 6 are isolated between each other and also protected in the vertical direction.

Further metal wiring layers may be added in the same way, optionally with vias through layer 4 in like manner as described above.

Finally a scratch protection and moisture barrier passivation layer 5, e.g. silicon nitride, may be deposited on top of the wafer.

In the case of the low voltage MiM_A, the capacitor dielectric layer 9 can be a very thin layer (thickness indicated as "ta" in FIG. 1) so that the capacitance density is maximised.

A portion of layer 10 forms the lower plate of MiM_A and a portion of layer 8 constitutes its upper plate. This portion of layer 8 is connected to the wiring layer 6 by means of tungsten plugs 7. The area of the conductor shape 8 (indicated by dashed lines in FIG. 1) determines the area of the MiM_A capacitor.

In the case of the high voltage MiM_B, the capacitor dielectric layer is the amount of material 3 which remains after the CMP polishing (or other flattening of layer 3) between layer 8 and layer 6—annotated by thickness "tb" in FIG. 1. Thickness tb will be a fraction or a portion of the usual thickness of layer 3 between the layers 6 and 10 due to the mechanical polishing which flattens the layer 3. The reduced thickness tb is useful to increase the capacitance density, but it is still thick enough to result in a high breakdown voltage for capacitor MiM_B. Because dielectric layer 3, even at the somewhat reduced thickness tb, is generally thicker than dielectric 9 it can withstand a larger voltage. But the capacitance density of MiM_B will usually be less than that of MiM_A, again because of greater dielectric thickness tb relative to ta.

The area of the MiM_B capacitor is determined by the region of overlap of the drawn layer shapes on layers 6 and 8 (indicated by dashed lines in FIG. 1).

Whilst not essential, in the case of the high voltage capacitor MiM_B the layers 8 and 10 are in electrical communication with each other. As shown in FIG. 1, these layers are connected together using tungsten plugs and a portion of the wiring layer 6; this can ensure that every conductive layer of the device is electrically connected in the final circuit, to avoid floating electrical nodes.

Figure 2:
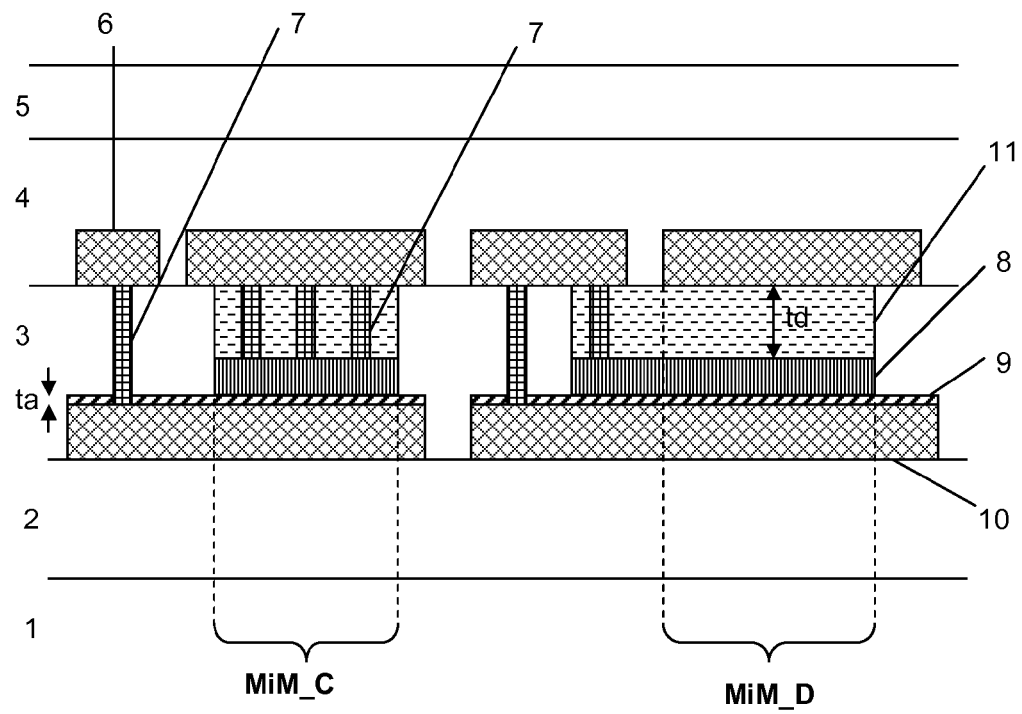
FIG. 2 shows a cross sectional view according to a second embodiment of the present invention.

FIG. 2 shows a second embodiment. Most details are similar to the first embodiment and will not be described again. However, when compared to the first embodiment, the non-conductor material 3 above the conductor 8 is removed and replaced with non-conductor layer 11. This may be accomplished, for example, by depositing a non-conductor film 11, e.g. silicon oxynitride or silicon nitride onto layer 8 before the photolithographic print and etch of the shapes of layer 8 and 11 (and before layer 3 is formed). That way the shapes 8 and 11 can be created with the same pattern transfer stage using the same pattern mask. Afterwards the layer 3 can be deposited and polished back to expose the upper regions of layer 11. Using this method the dielectric properties of the MiM_D high voltage capacitor can be separately altered, compared to the MiM_C low voltage capacitor, by suitable choice of the materials making up layers 9 and 11 (e.g. their dielectric constant may be different). The layer 11 has very little or no effect on MiM_C because the tungsten plugs 7 short circuit the region between layers 6 and 8 above this capacitor. The capacitance of MiM_C is (only) determined by the layer 9. For MiM_D the capacitance is determined by layer 11.

Figure 3:
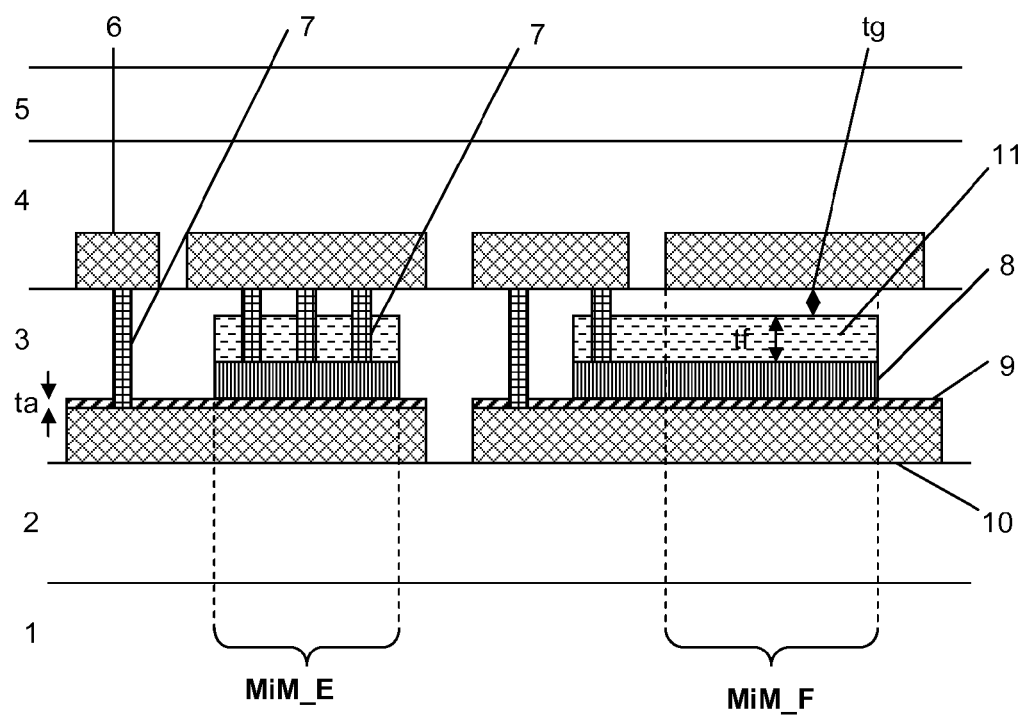
FIG. 3 shows a cross sectional view according to a third embodiment of the present invention.

FIG. 3 shows a third embodiment. Most details are similar to the first and second embodiments and will not be described again. In FIG. 3 the same method for creating layer 11 above conductor 8 is used as described with reference to FIG. 2, but the thickness of layer 11 is made less than the thickness of layer 3. This arrangement may be more convenient in the case where the high voltage MiM_F capacitor dielectric can be made thinner than layer 3, to allow intermediate operating voltages and slightly larger capacitance density. Residual capacitance of the layer 3 region labelled "tg" will be expected to alter the MiM_F capacitor value slightly. If the dielectric constant of layer 11 is significantly larger than that of layer 3 the effect will only be a small reduction of the total capacitance of the component.

Normally the dielectric constant of layer 3 is low (a low-k material), so that inter-metal capacitance is kept low on a process to reduce parasitic wiring capacitance loading on a circuit. But layer 11 can be made from a material with a much larger dielectric constant. The inclusion of a high-k dielectric layer 11 inside the MiM may be useful for processes where IMD layer 3 is made of a low-k dielectric. For low-k IMD metal stacked capacitors are less efficient for capacitance density.

The layer 11 material has very little or no effect on MiM_E, as described in relation to FIG. 2, because layer 8 is short circuited to layer 6 above the low voltage capacitor MiM_E.

The table below indicates which layer constitutes the lower and upper plate of the capacitors in the above embodiments, as well as the capacitor dielectric.

| Device | Lower plate | Upper Plate | Capacitor Dielectric |
|--------|-------------|-------------|----------------------|
| MiM_A  | Layer 10    | Layer 8     | Layer 9 (ta)         |
| MiM_B  | Layer 8     | Layer 6     | Layer 3 (tb)         |
| MiM_C  | Layer 10    | Layer 8     | Layer 9 (ta)         |
| MiM_D  | Layer 8     | Layer 6     | Layer 11 (td)        |
| MiM_E  | Layer 10    | Layer 8     | Layer 9 (ta)         |
| MiM_F  | Layer 8     | Layer 6     | Layer 11 (tf) + layer 3 (tg) |

Non-limiting examples of materials and thicknesses for various layers shown in the drawings are as follows.

| Name | Material | Thickness (nm) | Location |
|------|----------|----------------|----------|
| Metal (wiring) | AlCu alloy | 400-800 | Major (middle) portion of layers 10 and 6 |
| Wiring top/bottom | TiN | 15-100 | Thin top and/or bottom layer of layers 10 and 6 |
| Top/bottom plate | TiN/AlCu | 100-300 | Layer 8 |
| Capacitor dielectric | Silicon Nitride or Silicon Dioxide | 20-100 | Layer 9 |
| IMD  |          | 800-1200       | Layer 3  |
| ILD  |          | 600-1000       | Lowermost portion of Layer 2; part of this with additional IMD layers under the MiM |
| Passivation |   | 1000-2000      | Above the last metal, Layer 5 |

As described above, low voltage and high voltage MiM capacitors can be integrated on a common substrate. According to embodiments of the invention, the same process photolithographic mask can be used to create different portions of the device, which may result in simpler or more efficient manufacture and thereby reduce processing cost. The described technique allows the separate optimisation of capacitors for different circuit voltage applications which can co-exist on the same integrated circuit.

It will be appreciated that the various layers described herein, such as conductive layers 10, 8 and 6 and non-conductive layers 9, 3 and 11, may initially be formed as continuous layers which are subsequently patterned and etched to create discrete portions. Alternatively, these layers may be formed as discrete portions from the outset.

The thicknesses of the dielectric layers 9, 3 and 11 may be chosen to achieve a desired effect. Whilst the dielectric thickness of the high voltage capacitor would normally be chosen to be significantly larger than that of the low voltage capacitor, it is possible to choose the thicknesses such that the difference in thickness is less significant. For example, the thickness of the dielectric layer of the high voltage capacitor could be chosen to be only 1.5 times that of the thickness of the dielectric layer of the low voltage capacitor.

As mentioned, the present invention is not limited to MiM capacitors, but it will be understood that the present invention also finds application with other types of capacitors. Examples of alternative capacitors are, without limitation: supercapacitors, electrolytic capacitors, field sensing capacitors and capacitors with sensitised dielectrics used as chemical sensors elements. Supercapacitors (sometimes called ultracapacitors) are capacitors using materials with electrochemical effects to increase the capacitance value and allow a larger than normal energy storage between two conducting plates. They may use materials such as nano-particles of carbon instead of a conventional solid dielectric insulator to provide the electrostatic energy storage material. Electrolytic capacitors use combinations of different chemical layers, with a chemical electrolyte to form a high capacitance density device with electrical device polarity restrictions. In sensor elements the dielectric insulator material between conducting plates may be exposed to some medium so that it modifies the electrical properties—e.g. moisture absorption for a humidity sensor. Capacitor sensors can also be used to monitor other chemicals, e.g. toxic gases or ionic concentration changes in fluid chemical samples. Capacitor sensors can also be used to sense electrostatic potentials because they are sensitive to charging caused by nearby electric fields.

Although these capacitor types are different to conventional MiMs they may also be integrated within the semiconductor IC using the same techniques as described in relation to the present invention. This increases the utility of the invention for greater system integration of other types of capacitors on the same IC.

Although the invention has been described in terms of certain embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A capacitor device comprising:
   a first, a second and a third layer, each layer comprising a first discrete portion of conductive material located in a first region and a second discrete portion of conductive material located in a second region;
   wherein in the first region, the discrete portions of the second and third layers are in electrical communication with each other, and the discrete portions of the first and second layers are electrically isolated from each other, the discrete portions of the first and second layers forming a first capacitor; and
   wherein in the second region, the discrete portions of the first and second layers are in electrical communication with each other, and the discrete portions of the second and third layers are electrically isolated from each other, the discrete portions of the second and third layers forming a second capacitor.

2. The capacitor device of claim 1, further comprising dielectric material between the first layer and the second layer and between the second layer and the third layer.

3. The capacitor device of claim 2, wherein a thickness of the dielectric material between the second layer and the third layer is greater than the thickness of the dielectric material between the first layer and the second layer.

4. The capacitor device of claim 3, wherein the thickness of the dielectric material between the second layer and the third layer is at least 1.5 times the thickness of the dielectric material between the first layer and the second layer.

5. The capacitor device of claim 1, wherein the first and second capacitors have different breakdown voltages.

6. The capacitor device of claim 1, wherein the first, second and third layers are patterned.

7. The capacitor device of claim 1, wherein, in the region of the first capacitor, the second and third conductive layers are electrically connected by conductive material in at least one via.

8. The capacitor device of claim 1, wherein, in the region of the second capacitor, an electrical connection is formed between the first and second conductive layers comprising conductive material in at least one via.

9. The capacitor device of claim 8, wherein the electrical connection further comprises a discrete portion of the third layer separate from that region of the third layer which forms a plate of the second capacitor.

10. The capacitor device of claim 1, wherein the first and second capacitors are formed on a common substrate.

11. The capacitor device of claim 1, wherein the first and second capacitors are MiM (Metal Insulator Metal) capacitors.

12. The capacitor device as claimed in claim 1, wherein the first region forming the first capacitor and second region forming the second capacitor are electrically isolated from each other within the capacitor device.

13. The capacitor device as claimed in claim 1, wherein the first capacitor has two plates formed by the first discrete portion of the first layer and the first discrete portion of the second layer, and the second capacitor has two plates formed by the second discrete portion of the second layer and the second discrete portion of the third layer, and each of the plates of the first and second capacitors is electrically isolated from the other plates of the first and second capacitors within the capacitor device.

14. The capacitor device as claimed in claim 1, wherein
the first discrete portion of the first layer in the first region is electrically isolated, within the capacitor device, from the second discrete portion of the first layer in the second region;
the first discrete portion of the second layer in the first region is electrically isolated, within the capacitor device, from the second discrete portion of the second layer in the second region; and
the first discrete portion of the third layer in the first region is electrically isolated, within the capacitor device, from the second discrete portion of the third layer in the second region.

15. A method of forming a capacitor device, the method comprising:
forming a first layer;
forming a second layer over the first layer; and
forming a third layer over the second layer, wherein:
each layer is located partly in a first region and partly in a second region, and each layer comprises a first discrete portion of conductive material located in the first region and a second discrete portion of conductive material located in the second region; and
providing in the first region, electrical communication between the discrete portions of the second and third layers, and electrical isolation between the discrete portions of the first and second layers, such that the discrete portions of the first and second layers form a first capacitor; and
providing in the second region, electrical communication between the discrete portions of the first and second layers, and electrical isolation between the discrete portions of the second and third layers, such that the discrete portions of the second and third layers form a second capacitor.

16. The method of claim 15, wherein forming the at least two discrete portions of at least one of said first, second and third conductive layer comprises:
forming a continuous layer; and
patterning and etching the continuous layer so as to divide it into the at least two discrete portions.

17. The method as claimed in claim 15, wherein the first region forming the first capacitor and second region forming the second capacitor are formed such as to be electrically isolated from each other within the capacitor device.

18. The method as claimed in claim 15, wherein the first capacitor is formed with two plates formed by the first discrete portion of the first layer and the first discrete portion of the second layer, and the second capacitor has two plates formed by the second discrete portion of the second layer and the second discrete portion of the third layer, and each of the plates of the first and second capacitors is formed so as to be electrically isolated from the other plate of the first and second capacitors within the capacitor device.

19. A capacitor device comprising:
a first, a second and a third layer, each layer comprising conductive material;
the second layer being located between the first and third layers;
a first region comprising a first portion of each of the first, second and third layers;
a second region comprising a second portion of each of the first, second and third layers;
the first region being electrically isolated from the second region within the capacitor device;
wherein in the first region, the second and third layers are in electrical communication with each other, and the first and second layers are electrically isolated from each other, the first and second layers forming a first capacitor; and
wherein in the second region, the first and second layers are in electrical communication with each other, and the second and third layers are electrically isolated from each other, the second and third layers forming a second capacitor.

20. A capacitor device comprising:
a first, a second and a third layer, each layer comprising a first discrete portion of conductive material located in a first region and a second discrete portion of conductive material located in a second region;
wherein in the first region, the discrete portions of the first and second layers form the plates of a first capacitor; and
wherein in the second region, the discrete portions of the second and third layers form the plates of a second capacitor.

* * * * *